United States Patent
Chen et al.

(10) Patent No.: US 6,812,409 B2
(45) Date of Patent: Nov. 2, 2004

(54) LAYER ALLOCATING APPARATUS FOR MULTI-LAYER CIRCUIT BOARD

(75) Inventors: Chun Hung Chen, Taipei (TW); Hsiu Tzu Chen, Pan Chiao (TW); Yen Chen Chen, Pan Chiao (TW)

(73) Assignee: Via Technologies, Inc., Taipei Hisen (TW)

( * ) Notice: Subject to any disclaimer, the term of this patent is extended or adjusted under 35 U.S.C. 154(b) by 137 days.

(21) Appl. No.: 10/330,297

(22) Filed: Dec. 30, 2002

(65) Prior Publication Data

US 2004/0006407 A1 Jan. 8, 2004

(30) Foreign Application Priority Data

Jul. 5, 2002 (TW) .................................. 91114995 A

(51) Int. Cl.$^7$ ................................................ H05K 1/03
(52) U.S. Cl. ................ 174/255; 174/260; 174/262; 361/777; 361/780; 361/794
(58) Field of Search ............................. 174/255, 260, 174/261, 262, 263, 264, 266; 361/760, 792, 793, 794, 795, 780, 777

(56) References Cited

U.S. PATENT DOCUMENTS 5,131,140 A * 7/1992 Zimmer ...................... 29/846
5,682,298 A * 10/1997 Raynham .................... 361/794
5,736,796 A * 4/1998 Price et al. ................. 307/151
6,465,890 B1 * 10/2002 Poddar et al. .............. 257/773

* cited by examiner

Primary Examiner—Evan Pert
Assistant Examiner—J B Patel
(74) Attorney, Agent, or Firm—Birch, Stewart, Kolasch & Birch, LLP

(57) ABSTRACT

A layer allocating apparatus for a multi-layer circuit board is disclosed. In a preferred embodiment, the layer allocating apparatus arranged from top to bottom as a component layer, a ground layer, a power layer, and a solder layer. The powerlayer is sliced into a plurality of reference ground areas each is located at somewhere to correspond to signal layout areas of the solder layer, so as to allow signal lines of the component layer and solder layer to take reference to the reference ground areas on the adjacent power layer. The power layer also includes a plurality of power layers each provides different operating voltages, and electrically couples with corresponding power layouts of the solder layer and component layer through vias, thereby enlarging the total area of power planes, so as to provide a table power source and attenuate the ground/bounce effect.

20 Claims, 6 Drawing Sheets

LAYER ALLOCATING APPARATUS FOR MULTI-LAYER CIRCUIT BOARD

BACKGROUND OF THE INVENTION

1. Field of the Invention

The present invention relates to a layer allocating apparatus for a multi-layer circuit board, and more particularly, to a layer allocating apparatus having reference ground areas formed on the power layers, so as to allow signal layout areas of solder layers to take reference to the reference grounding areas of the power layer to which the solder layer is adjacent, thereby improving the signal transmission quality of the solder layer to the same level the component layer pertains. Still, the present invention discloses a layer allocating apparatus with an enlargeable area for each power layer, which is obtained by setting vias to electrically couple with corresponding power planes of component layers, power layers, and solder layers, so as to have a stable power source and attenuate the ground/bounce effect simultaneously.

2. Description of the Prior Art

Recently, the four-layer circuit board has gradually replaced the six-layer counterpart to become the most widely used circuit board apparatus. Basically speaking, the four-layer circuit board is arranged from top to bottom as follows: component layer, ground layer, power layer, and solder layer. Among these layers of different purposes, the component layer is for placing the integrated circuitry and the primary part of signal lines, and the ground layer consists of a complete and slicing-free copper foil for connecting to the ground voltage. Besides, the power layer further includes a plurality of areas each stands for a power plane to provide different voltage levels to different components. The solder layer includes solder balls for soldering with other circuit boards and has some non-critical signals, such as memory address signals and control signals, arranged thereon. However, those critical signals, such as address strobe signals, data strobe signals, timing signals should be located in the component layer because they must be transmitted under a circumstance having better signal transmission quality.

Please refer to FIG. 1 of a schematic diagram of a layer allocating apparatus based on the prior art, wherein the motherboard and the circuit board is illustrated on a four-layer stacking apparatus basis, and the mother board upholds the circuit board, integrated circuit component 164, and other integrated circuit components such as 64A and 64B. The stacking apparatus 62 of motherboard is arranged as a component layer 65, a ground layer 66, a power layer 67, and a solder layer 68, from top to bottom in this order. The component layer 65 includes many other components, such as the integrated circuit component 164, and the signal line layout for connecting electrically with these components. Additionally, some other signal lines are placed on the solder layer 68. The same four-layer stacking apparatus 63A applies to the circuit board having a component layer 165A, a ground layer 166A, a power layer 167A, and a solder layer 168A, from top to bottom as well as the circuit board stacking apparatus 63B, which includes a component layer 165B, a ground layer 166B, a power layer 167B, and a solder layer 168B. For example, as signals transmitted from the integrated circuit component 64A to another integrated circuit component 64B first pass to the component layer 165A, then the ground layer 166A, the power layer 167A, the solder layer 168A, and via 69A of the solder layer 168A, so as to couple with the component layer 65 of the motherboard stacking apparatus 62. Thereafter, signals go through the via 69B of the target circuit board stacking apparatus 63B, the solder layer 168B, the power layer 167B, the ground layer 166B, and the component layer 165B, to reach the integrated circuit component 64B.

Please refer to FIG. 2 of a schematic diagram illustrating how the prior art power layer is arranged. The purpose of slicing the power layer into several power planes is to supply different operating voltages to different components. As shown in FIG. 2, the power layer includes a plurality of power planes 11, 12, 13, 14, 15, and 16, each of which is isolated from the others by the isolated line 21, for the sake of preventing interferences. Besides, each of these power planes includes a plurality of vias 22 for electrically coupling the component layer 165A and the solder layer 168A, so as to provide operating voltages with components placed thereon. With different operating voltage requirements, these power planes 11, 12, 13, 14, 15, and 16 are configured to provide different voltages. Taking the north bridge chip of the chipset for example, due to the north bridge chip is connected with the CPU, the memory, the south bridge chip, and the AGP device, power planes 12, 13, 14, and 15 provide different operating voltages respectively to meet the needs of CPU, memory, south bridge chip, and AGP device. Meanwhile, the voltage provided by the power plane 11 depends on if the north bridge chip supports any graphic device, and the remaining power plane 16 serves to be a ground voltage area. Therefore, as signals transmit between the north bridge chip and the CPU, memory, south bridge chip, or AGP device, these configured power planes each provides different voltages are viable.

As the integrated circuitry becomes more and more complicated and frequency demands become increasingly higher and higher, providing powers only through the power layer is not going to satisfy the requirement, because the current providing capabilities of these sliced power planes are limited, which is the consequence of limited plane size after the power layer is sliced for the sake of supplying different powers. Under this circumstance, the power plane ultimately generates a significant amount of ground/bounce effect, leading to unstable high-frequency signals and further resulting in malfunction of the whole system. While the distribution of vias become more and more concentrated, but the pitch between adjacent two signal lines, generally ranging from 3 to 5 mms inside a single chip, poises a constraint when it comes to arranging these vias. Currents provided by a small amount of vias may not provide enough connections with the power layer and components, causing these currents more and more unstable. Additionally, the critical signals are usually located in the component layer instead of in the solder layer, which significantly constrains design flexibility for designers.

SUMMARY OF THE INVENTION

The primary objective of the present invention is to disclose a layer allocating apparatus, which provides reference ground areas on the power layer, so as to allow signal lines of the solder layer to take reference to some reference ground areas of the power plane to which the solder layer is adjacent. Thereby, the signal transmission quality of the solder layer is supposed to be substantially equivalent to that of the power layer.

Still another objective of the invention is to disclose a layer allocating apparatus having enlargeable power planes. For this purpose, vias are set to electrically couple corresponding power planes on the component layer and solder layer, increasing the total area of power planes, so as to become a stable power source and attenuate the ground/bounce effect.

In a preferred embodiment, which is a 4-layer stacking apparatus arranged from top to bottom as a component layer, a ground layer, a power layer, and a solder layer, wherein the power layer includes a plurality of reference ground areas each is set to be located according to a corresponding signal layout area on the solder layer. In this way, signal lines of the solder layer and component layer all take reference to reference voltages of the ground layer and power layer, resulting in the substantially equivalent signal transmission quality for the solder layer and component layer, so as being able to place some critical components on the solder layer and then release some other space on the component layer.

In other words, the present invention discloses the same layout for power planes on the corresponding areas of the component layer, power layer, and solder layer. Power planes of the component layer, power layer, and solder layer are further communicated with their counterparts on different layers through the setting of vias, thereby increasing the total power plane area to supply stable power sources and lower down the ground/bounce effect.

These and other objectives of the present invention will no doubt become obvious to those of ordinary skill in the art after reading the following detailed description of the preferred embodiment which is illustrated in the various figures and drawings.

DETAILED DESCRIPTION OF THE PREFERRED EMBODIMENT

Figure 1:
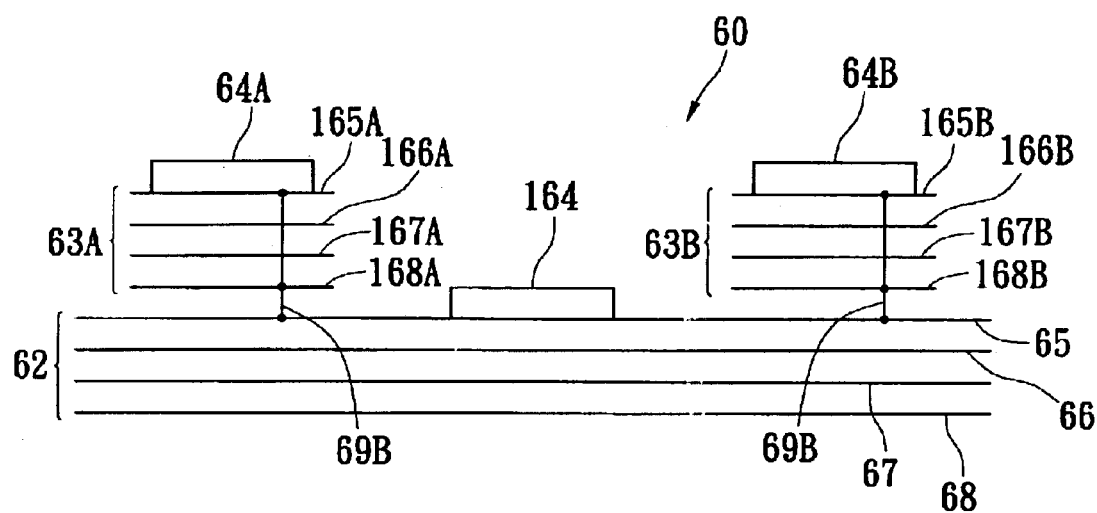
FIG. 1 is a cross sectional view of a prior art 4-layer stacking apparatus.
Figure 2:
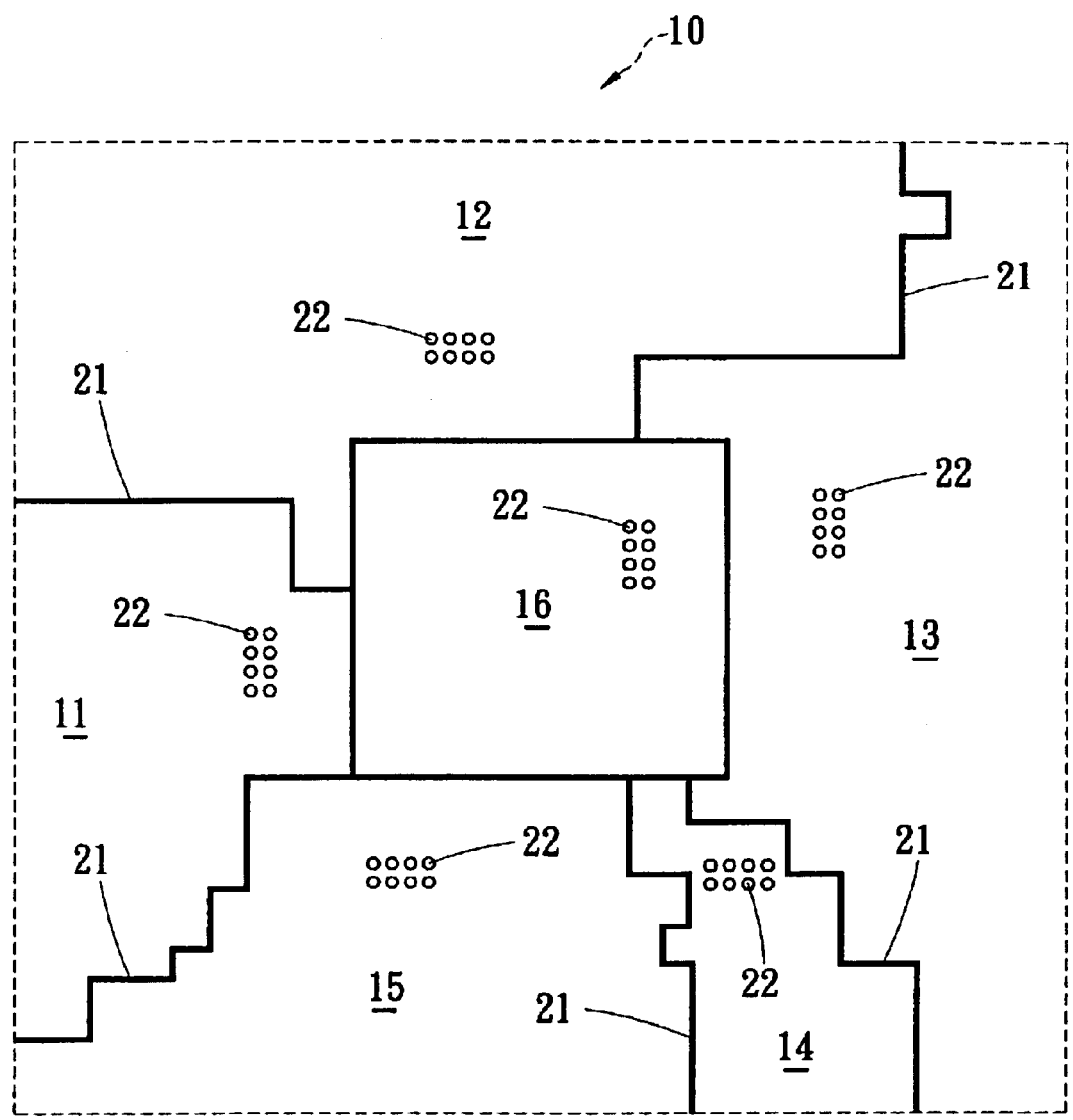
FIG. 2 is a planar diagram of illustrating the slicing of a power layer.
Figure 3A:
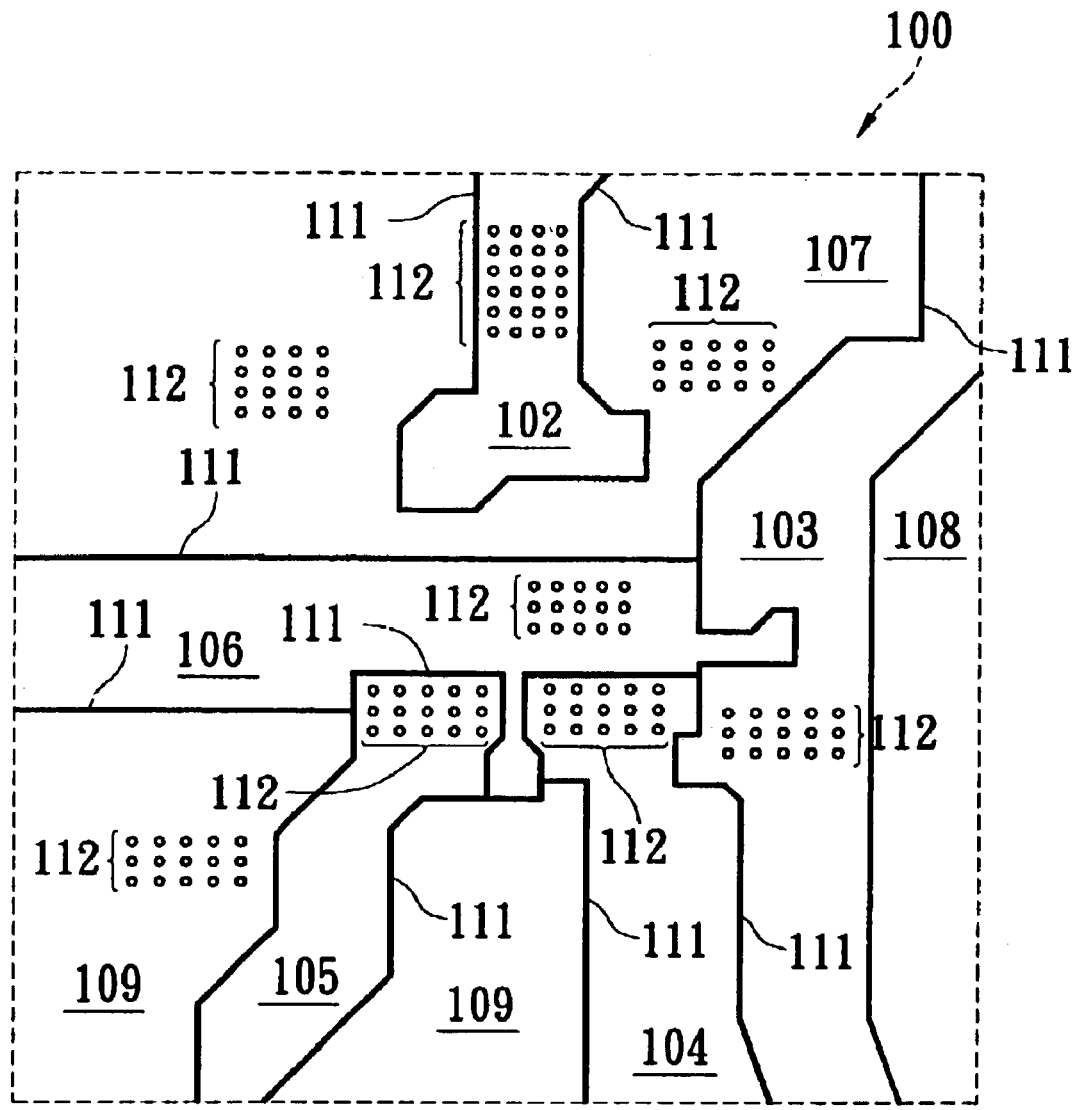
FIG. 3A is a planar diagram of illustrating the power layer of the present invention.
Figure 3B:
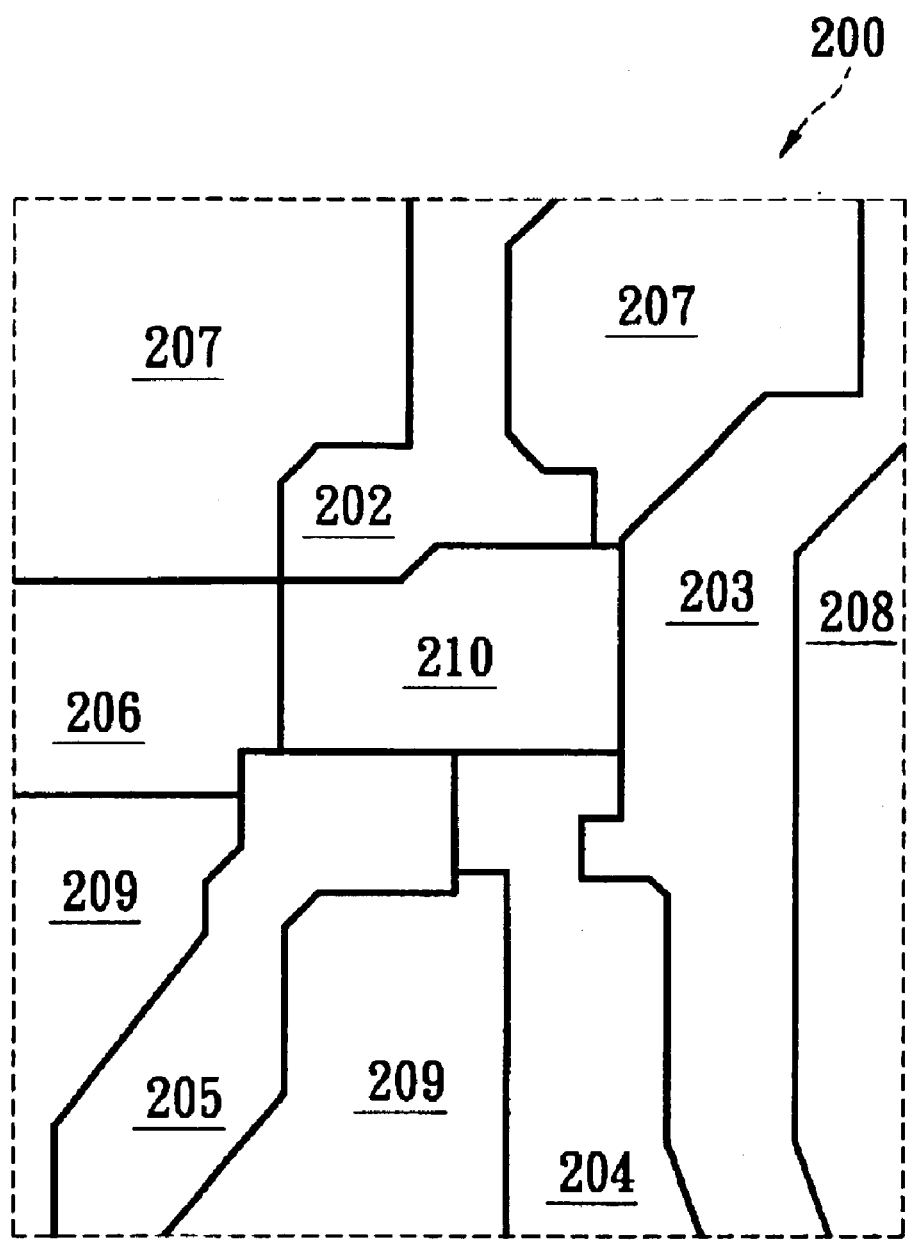
FIG. 3B is a planar diagram of illustrating a component layer of the present invention.
Figure 3C:
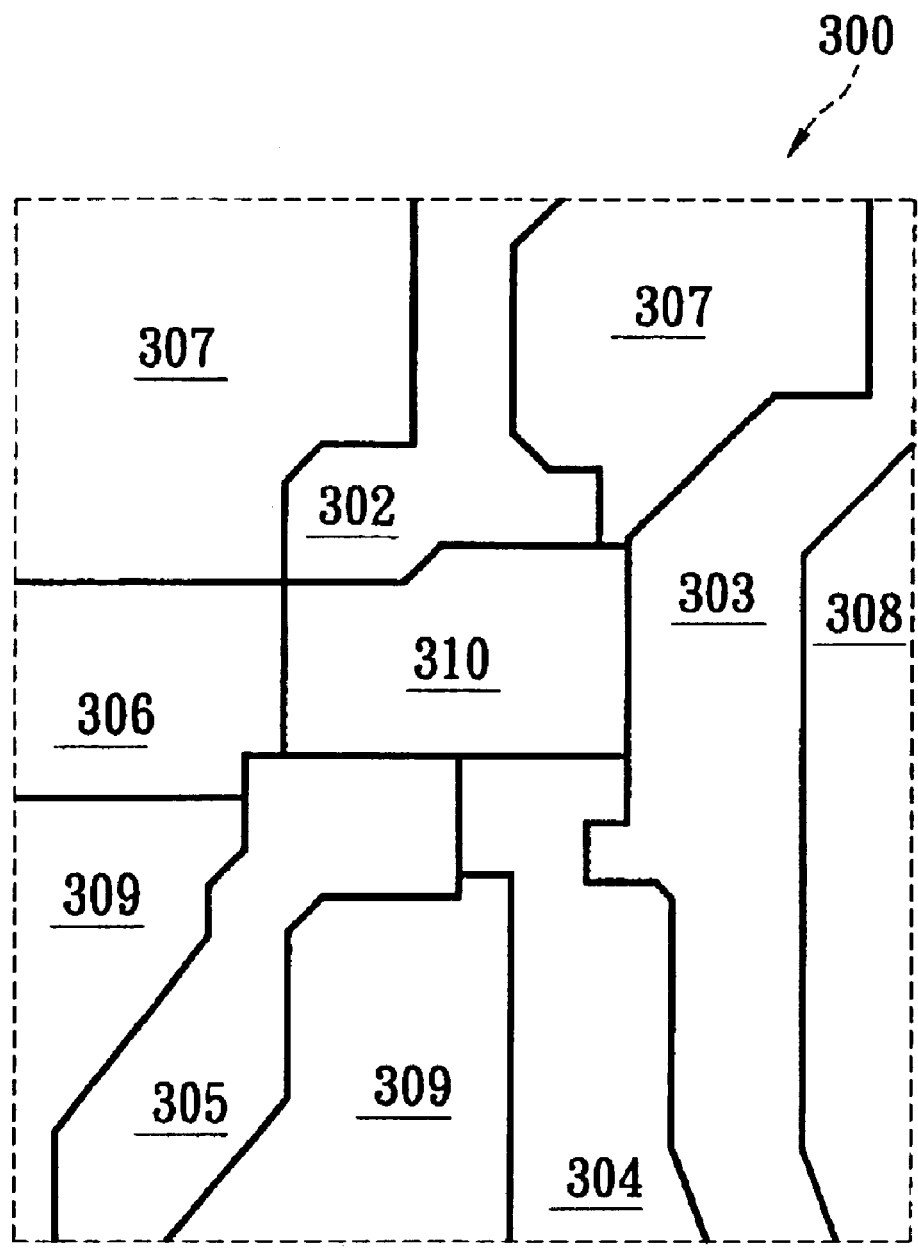
FIG. 3C is a planar diagram of illustrating a solder layer of the present invention.

Please refer to FIG. 3A, FIG. 3B, and FIG. 3C of respectively illustrating a planar schematic diagram for a power layer 100, component layer 200, and solder layer 300 of the preferred embodiment. The ground layer of this embodiment is a sliced-free copper foil, as same as a prior art ground layer, thus no further explanation for the ground layer is presented, even the ground layer is omitted from these drawings for the sake of simple description. The power layer 100 of FIG. 3A is primarily consisted of a copper foil, but includes a plurality of power planes 102, 103, 104, 105, and 106 each provides its own operating voltage, and a plurality of reference ground areas 107, 108, and 109 connecting to a ground voltage. Power planes 102, 103, 104, 105, and 106, and reference ground areas 107, 108, and 109 are isolated from each other by isolated lines 111 for the purpose of preventing interferences. Locations of these reference ground areas 107, 108, and 109 correspond to signal layout areas of the solder layer 300, so as to allow signal lines of the solder layer 300 to take reference to the ground voltage as well as signal lines of the component layer. Additionally, the power layer 100 includes a plurality of vias 112 for electrically coupling with power planes located on the component layer 200 and solder layer 300, supplying voltages provided by power planes to the component layer 200 and solder layer 300, or grounding the reference ground areas 107, 108, and 109 to the ground voltage.

Based on FIGS. 3B and 3C, layouts of the component layer 200 and the solder layer 300 are substantially equivalent, as well as the power area distributions of the power layer 200, and component layer 300. For example, the component layer 200 includes power planes 202, 203, 204, and 205, and signal layout areas 206, 207, 208, 209, and 210 thereon, and the solder layer 300 includes power planes 302, 303, 304, and 305, and signal layout areas 306, 307, 308, 309, and 310. Power planes correspondingly located at the component layer 200 and solder layer 300 from a vertical viewpoint communicate with others through vias. Besides, all of these power planes communicate with power planes of the power layer 100 as well, thereby enlarging the total equivalent area of power planes. Still taking the north bridge chip of the chipset for example, power planes 102, 202, and 302 communicate with others through vias, so as to provide operating voltages CPU. Other power planes of the north bridge chip, such as 103, 203, and 303, all of which communicate with others through vias also, are for supplying operating voltages to the memory, such as DRAM. The same rule applies to power planes 104, 204, and 304, all of which are for communicating with the south bridge chip, and power planes 105, 205, and 305 for communicating with AGP device bi-directionally. All power planes communicate with others through vias, consequently enlarging the equivalent area for these power planes, further resulting in more stable power supplies, and at the meantime, attenuating the ground/bounce effect.

In another respect, signal layout areas located correspondingly on distinct layers are configured to transmit signals to/receive signals from the same components respectively. In the preferred embodiment, signal layout areas 207 and 307 are for setting signal transmission lines communicating the north bridge chip and CPU, signal layout areas. 208 and 308 are for signal transmission lines communicating the north bridge chip and memory, and signal layout areas 209 and 309 are for signal transmission lines communicating the north bridge chip and AGP device. Furthermore, signal layout areas 206 and 306 are for signal lines communicating the north bridge chip and CPU and AGP device, and signal layout areas 210 and 310 are to connect with a ground voltage and respectively for ground solder pads on the component layer and solder balls on the solder layer. These signal layout areas 210 and 310 are paved with a copper foil or not, depending on different applications. Because power planes 107, 108, and 109 connect to the ground voltage, thereby serving as reference voltage areas, and signal layout areas 307, 308, and 309 under these reference voltage areas (solder layer 300) respectively take reference to power planes 107, 108, and 109. Meanwhile, signal layout areas 207, 208, and 209 of the component layer 200 take reference to the ground layer below the component layer 200.

Figure 4:
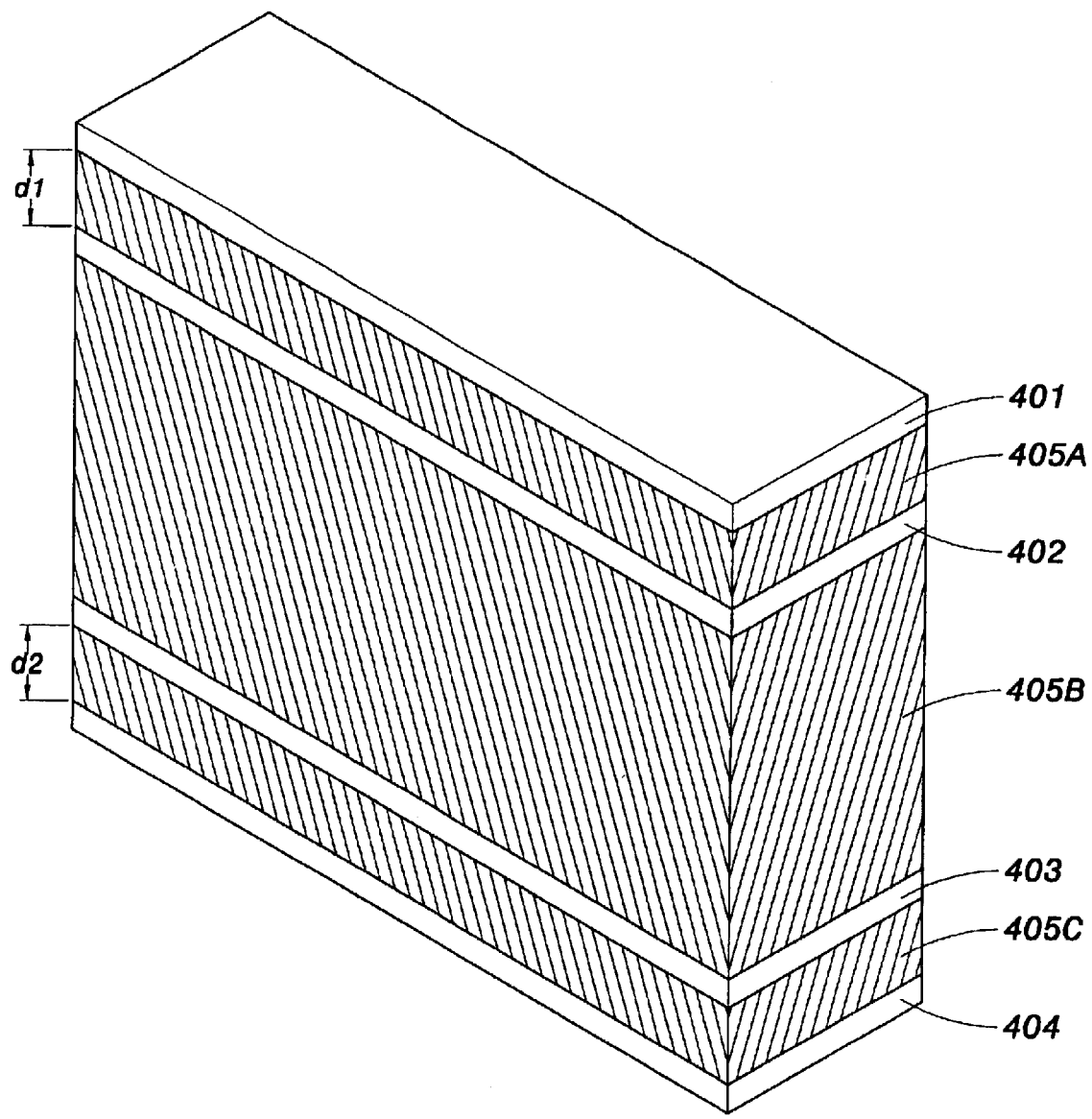
FIG. 4 is a structure schematic diagram of showing the present invention layer allocating layer apparatus for a multi-layer circuit board based on the preferred embodiment according to the present invention.

Still, in a preferred embodiment, there are some more demands for the 4-layer stacking apparatus. As shown in FIG. 4, the 4-layer stacking apparatus for a circuit board 400, as long as the physical characteristics, such as the return path, of the component layer 401 and physical characteristics of the ground layer 402 referencing to the component layer 401, and those of the solder layer 404 and the power layer 403 referencing to the solder layer 404 are substantially equivalent, the solder layer 404 serves as an extending component layer, thereby designers are capable of placing layouts for some critical signals thereon, so as to release some more space of the original component layer 401. Because physical characteristics of the component layer 401 and the referencing ground layer 402 thereof, the physical characteristics of the solder layer 404 and the referencing power layer 403 thereof depend on the metal or alloy materials of the component layer 401 and solder layer 404, the layer-to-layer spacing between the component layer 401 and its referencing ground layer 402, and the layer-to-layer spacing between the solder layer 404 and its referencing power layer 403, making the materials consisted of the component layer 401 and solder layer 404, and the ground layer 402 and power layer 403 weigh substantially equal, preferably equal to 0.5 oz and 1 oz, respectively is viable to achieve the above outcome in practical use. Additionally, adopting the same insulation layer 405A, 405B, and 405C, and making the layer-to-layer spacing between the component layer 401 and ground layer 402, and the layer-to-layer spacing between the solder layer 404 and power layer 403 substantially equal (in other words, the height of the insulation layers 405A and 405B are equal or d1=d2) is also another way to accomplish the task of letting physical characteristics of the component layer 401 and referencing ground layer 402, and physical characteristics of the solder layer 404 and the referencing power layer 403 substantially equivalent.

In contrast to prior arts, the layer allocating apparatus for a multi-layer circuit board is advantageous on providing a plurality of reference ground areas on the power layer to make physical characteristics of all signal layers and their corresponding reference ground or ground layers substantially equivalent, thereby to release some space of the original component layer and enhance the design flexibility for the circuit board. The present layer allocating apparatus places power plane layouts not only on the power plane, but the component layer and solder layer, and then communicate these power planes through vias, thereby enlarging the equivalent area of all power planes, so as to provide stable operating powers with integrated circuit components on the circuit board and attenuate the ground/bounce effect, given the anticipation of more and more complicated circuitry design and higher and higher operating frequencies.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A layer allocating apparatus for a multi-layer circuit board comprising:
   a top signal layer having a plurality of power planes and a plurality of signal layout areas;
   a reference layer under said top signal layer, coupling with a reference voltage, wherein said top signal layout areas take reference to said reference layer;
   a power layer under said reference layer and having a plurality of power planes and a plurality of reference voltage areas; and
   a bottom signal layer under said power layer and having a plurality of power planes and a plurality of signal layout areas, wherein said signal layout areas of said bottom signal layer take reference to said reference voltage areas of said power layer.

2. The layer allocating apparatus of claim 1, wherein said power planes of said top signal layer, said power layer, and bottom layer mutually electrically couple with others through vias.

3. The layer allocating apparatus of claim 1, wherein each of said reference voltage areas is electrically coupled with said reference voltage.

4. The layer allocating apparatus of claim 3, wherein said reference voltage is a ground voltage.

5. The layer allocating apparatus of claim 1, wherein said signal layout areas of said bottom signal layer serve to locate critical signals.

6. The layer allocating apparatus of claim 1, wherein said reference voltage areas of the power layer are located according to said signal layout areas of said bottom signal layer.

7. The layer allocating apparatus of claim 1, wherein the physical characteristics between said top signal layer and said reference voltage layer, and said bottom signal layer between said reference voltage area of said power layer are substantially equivalent.

8. The layer allocating apparatus of claim 7, wherein metals composed of said power layer and reference voltage layer, and said bottom signal layer and said reference voltage area of said power layer weigh substantially equally.

9. The layer allocating apparatus of claim 7, wherein materials composed of insulation layers between said top signal layer and said reference voltage layer, and said bottom signal layer and said reference voltage layer are substantially equivalent.

10. The layer allocating apparatus of claim 9, wherein the layer-to-layer spacing between said top signal layer and said reference voltage layer is substantially equal with the layer-to-layer spacing between said bottom signal layer and said reference voltage layer.

11. A layer allocating apparatus for a multi-layer circuit board comprising:
    a top signal layer having a plurality of power planes and a plurality of signal layout areas;
    a ground voltage layer under said top signal layer and coupling with a ground voltage, wherein said signal layout areas of said top signal layer take reference to said ground voltage layer;
    a power layer under said ground voltage layer and having a plurality of said power planes and a plurality of ground voltage areas, wherein said ground voltage areas electrically couple with said ground voltage and said power planes and said ground voltage areas are spaced from isolated lines; and
    a bottom signal layer under said power layer and having a plurality of said power planes and a plurality of said signal layout areas, wherein said corresponding power planes of said top signal layer, said power layer, and said bottom signal layer couple with others through a plurality of vias, so as to enlarge the total equivalent area of said power planes.

12. The layer allocating apparatus of claim 11, wherein said signal layout areas of said bottom signal layer serve to locate critical signals.

13. The layer allocating apparatus of claim 11, wherein said reference voltage areas of the power layer are located according to said signal layout areas of said bottom signal layer.

14. The layer allocating apparatus of claim 11, wherein physical characteristics between said top signal layer and said ground voltage layer, and said bottom signal layer and said ground voltage area are substantially equivalent.

15. The layer allocating apparatus of claim 12, further comprising insulation layers between said top signal layer and said ground voltage layer, and said bottom signal layer and said ground voltage area of said power layer, said insulation layers having the substantially equivalent physical characteristic, wherein the layer-to-layer spacing between said top signal layer and said ground voltage layer is substantially equal to the layer-to-layer spacing between said bottom signal layer and said ground voltage area of said power layer.

16. A power layer layout apparatus for a multi-layer circuit board layer allocating apparatus, wherein said layer allocating apparatus comprises a top signal layer, a reference voltage layer, a power layer, and a bottom signal layer, said power layer layout apparatus comprising:

a plurality of power planes each electrically coupling with a corresponding power plane of said top signal layer and bottom signal layer;

a plurality of reference voltage areas each electrically coupling with a reference voltage, wherein signal layout areas of said bottom signal layer take reference to said reference voltage areas; and a plurality of isolated lines for isolating said power planes from said reference voltage areas, so as to prevent interferences from said power planes and said reference voltage areas.

17. The power layer layout apparatus of claim 16, wherein said corresponding power planes of said top signal layer, said power layer, and said bottom signal layer mutually electrically couple with others through vias so as to equivalently enlarge the total area of said power planes.

18. The power layer layout apparatus of claim 16, wherein physical characteristics between said top signal layer and said reference voltage layer, and said bottom signal layer and said reference voltage layer are substantially equivalent, and metals composed of said power layer and said reference voltage layer, and said top signal layer and said bottom signal layer weigh substantially equal.

19. The power layer layout apparatus of claim 18, further comprising insulation layers between said top signal layer and said reference voltage layer, and said bottom signal layer and said reference voltage area of said power layer, said insulation layers being substantially equivalent, wherein the layer-to-layer spacing between said top signal layer and said reference voltage layer is substantially equal to the layer-to-layer spacing between said bottom signal layer and said reference voltage area of said power layer.

20. The power layer layout apparatus of claim 16, wherein said signal layout areas of said bottom signal layer serve to locate critical signals.

* * * * *